(12) United States Patent
Bhat et al.

(10) Patent No.: US 8,208,241 B2
(45) Date of Patent: Jun. 26, 2012

(54) CRYSTALLOGRAPHICALLY ORIENTATED TANTALUM PENTOXIDE AND METHODS OF MAKING SAME

(75) Inventors: Vishwanath Bhat, Boise, ID (US); Vassil Antonov, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1057 days.

(21) Appl. No.: 12/132,758

(22) Filed: Jun. 4, 2008

(65) Prior Publication Data

US 2009/0303657 A1 Dec. 10, 2009

(51) Int. Cl.
*H01G 4/06* (2006.01)

(52) U.S. Cl. .................. 361/321.5; 361/321.2; 361/311; 361/312; 361/313; 361/306.1; 438/386; 438/387; 438/686; 438/785

(58) Field of Classification Search .................. 438/785, 438/686, 239, 243, 386–387; 427/98.6, 97.7; 361/321.5, 321.2, 311–313
See application file for complete search history.

(56) References Cited

U.S. PATENT DOCUMENTS

| | | | |
|---|---|---|---|
| 5,256,244 A | 10/1993 | Ackerman | |
| 6,074,945 A | 6/2000 | Vaartstra et al. | |
| 6,096,592 A | 8/2000 | Cho | |
| 6,136,641 A | 10/2000 | Won et al. | |
| 6,136,704 A | 10/2000 | Maya | |
| 6,472,264 B1 | 10/2002 | Agarwal | |
| 6,559,000 B2 | 5/2003 | Kim et al. | |
| 6,656,788 B2 | 12/2003 | Park et al. | |
| 6,740,553 B1 | 5/2004 | Lee et al. | |
| 6,770,525 B2 | 8/2004 | Lee et al. | |
| 6,770,561 B2 | 8/2004 | Kim | |
| 6,784,504 B2 | 8/2004 | Derderian et al. | |
| 6,787,414 B2 | 9/2004 | Lee | |
| 6,794,284 B2 | 9/2004 | Vaartstra | |
| 6,815,221 B2 | 11/2004 | Kim et al. | |
| 6,853,535 B2 | 2/2005 | Fox et al. | |
| 6,855,594 B1 | 2/2005 | Gealy et al. | |
| 6,863,725 B2 | 3/2005 | Vaartstra et al. | |
| 6,916,699 B1 | 7/2005 | Agarwal | |
| 6,967,159 B2 | 11/2005 | Vaartstra | |
| 7,018,675 B2 * | 3/2006 | Yang | 427/250 |
| 7,030,042 B2 | 4/2006 | Vaartstra et al. | |
| 7,056,784 B2 | 6/2006 | Bhat et al. | |

(Continued)

FOREIGN PATENT DOCUMENTS

KR 20030051231 6/2003

(Continued)

OTHER PUBLICATIONS

International Search Report and Written Opinion of PCT/US2009/044084, dated Aug. 26, 2009, 12 pgs.

(Continued)

*Primary Examiner* — Nguyen T Ha
(74) *Attorney, Agent, or Firm* — Wells St. John, P.S.

(57) ABSTRACT

Methods of forming an oxide are disclosed and include contacting a ruthenium-containing material with a tantalum-containing precursor and contacting the ruthenium-containing material with a vapor that includes water and optionally molecular hydrogen ($H_2$). Articles including a first crystalline tantalum pentoxide and a second crystalline tantalum pentoxide on at least a portion of the first crystalline tantalum pentoxide, wherein the first tantalum pentoxide has a crystallographic orientation that is different than the crystallographic orientation of the second crystalline tantalum pentoxide, are also disclosed.

20 Claims, 2 Drawing Sheets

U.S. PATENT DOCUMENTS

| | | |
|---|---|---|
| 7,115,929 B2 | 10/2006 | Bhat et al. |
| 7,122,464 B2 | 10/2006 | Vaartstra |
| 7,132,710 B2 | 11/2006 | Baik et al. |
| 7,153,786 B2 | 12/2006 | Kim et al. |
| 7,196,007 B2 | 3/2007 | Vaartstra |
| 7,256,123 B2 | 8/2007 | Derderian et al. |
| 7,262,132 B2 | 8/2007 | Marsh |
| 7,288,453 B2 | 10/2007 | Jeong et al. |
| 7,368,402 B2 | 5/2008 | Vaartstra et al. |
| 7,605,030 B2 * | 10/2009 | Forbes et al. ............. 438/184 |
| 7,662,729 B2 * | 2/2010 | Ahn et al. ............. 438/785 |
| 8,012,532 B2 * | 9/2011 | Bhat et al. ............. 427/98.6 |
| 2003/0109110 A1 | 6/2003 | Kim |
| 2003/0134511 A1 | 7/2003 | Kim |
| 2005/0019978 A1 | 1/2005 | Vaartstra et al. |
| 2005/0087789 A1 | 4/2005 | Baik et al. |
| 2005/0145916 A1 | 7/2005 | Park et al. |
| 2005/0156256 A1 | 7/2005 | Kim et al. |
| 2005/0194622 A1 | 9/2005 | Lee et al. |
| 2005/0196915 A1 | 9/2005 | Jeong et al. |
| 2005/0227003 A1 | 10/2005 | Carlson et al. |
| 2005/0227433 A1 | 10/2005 | Bhat et al. |
| 2005/0238808 A1 | 10/2005 | Gatineau et al. |
| 2005/0287804 A1 | 12/2005 | Vaartstra |
| 2006/0008966 A1 | 1/2006 | Forbes et al. |
| 2006/0014384 A1 | 1/2006 | Lee et al. |
| 2006/0019033 A1 | 1/2006 | Muthukrishnan et al. |
| 2006/0040444 A1 | 2/2006 | Lee et al. |
| 2006/0040480 A1 | 2/2006 | Derderian et al. |
| 2006/0145294 A1 | 7/2006 | Bhat et al. |
| 2006/0157861 A1 | 7/2006 | Park et al. |
| 2006/0234502 A1 | 10/2006 | Bhat et al. |
| 2006/0244033 A1 | 11/2006 | Baik et al. |
| 2006/0251813 A1 | 11/2006 | Carlson et al. |
| 2006/0292788 A1 | 12/2006 | Vaartstra |
| 2007/0048953 A1 | 3/2007 | Gealy et al. |
| 2007/0049053 A1 | 3/2007 | Mahajani |
| 2007/0144438 A1 | 6/2007 | Vaartstra |
| 2007/0166999 A1 | 7/2007 | Vaartstra |
| 2007/0238259 A1 | 10/2007 | Bhat et al. |
| 2008/0014694 A1 | 1/2008 | Bhat et al. |
| 2008/0064210 A1 | 3/2008 | Vaartstra |
| 2009/0155486 A1 | 6/2009 | Bhat et al. |

FOREIGN PATENT DOCUMENTS

| | | |
|---|---|---|
| WO | WO 2005/113852 | 12/2005 |
| WO | WO 2005/117087 | 12/2005 |
| WO | WO 2005/117087 A1 | 12/2005 |
| WO | PCT/US2009/044084 | 12/2010 |

OTHER PUBLICATIONS

Motohira and Taga, "Thin film retardation plate by oblique deposition," *Applied Optics*, Jul. 1, 1989;28(13):2466-2482.

"Catalytic Steam Generation Systems," [online]. Ultra Clean Technology, Sieger Engineering Inc., 2007 [retrieved on Apr. 1, 2008]. Retrieved from the Internet:<URL:http://www.uct.com/products/csgt/html>;1 pg.

Cho et al., "Low Temperature crystallized $Ta_2O_5/Nb_2O_5$ bi-layers integrated into RIR capacitor for 60 nm generation and beyond," *Microelectronic Engineering*, Jun. 2005;80:317-320.

Hawley, "The Condensed Chemical Dictionary," $10^{th}$ Edition, Van Nostrand Reinhold Co., New York, 1981:225.

U.S. Appl. No. 11/743,246, filed May 2, 2007, Bhat.

U.S. Appl. No. 11/958,952, filed Dec. 18, 2007, Bhat et al.

U.S. Appl. No. 12/106,510, filed Apr. 21, 2008, Vaartstra et al.

Kingery et al., "Introduction to Ceramics," $2^{nd}$ Edition, John Wiley & Sons, New York, NY, 1976:pp. 44-56.

Lim et al., "Improvement of Contact Resistance between Ru Electrode and TiN Barrier in Ru/Crystalline-$Ta_2O_5$/Ru Capacitor for 50 nm Dynamic Random Access Memory," *Jap. J Applied Physics*, Part 1, Apr. 21, 2005;44(4B):2225-2229.

Ohkawa et al., "Highly Reliable Gate Oxidation using Catalytic Water Vapor Generator (WVG) for MOS device fabrication," *Thin Solid Films*, Feb. 2002;405(1-2):290-299.

"Ultra Clean Technology: The Leader in Gas & Liquid Delivery Systems," Press Release, Jul. 22, 2002. [retrieved on Mar. 20, 2008]. Retrieved from the Internet:<URL:http://www.uct.com/press/2002/072202.html>;1 pg.

Vehkamäki et al., "Growth of $SrTiO_3$ and $BaTiO_3$ Thin Films by Atomic Layer Deposition," *Electrochemical and Solid-State Letters*, 1999;2(10):504-506.

"WVG Water Vapor Generator. Safety & Clean Technology," datasheet. Fujikin Incorporated, Osaka, Japan, Aug. 27, 2007: 5 pgs.

* cited by examiner

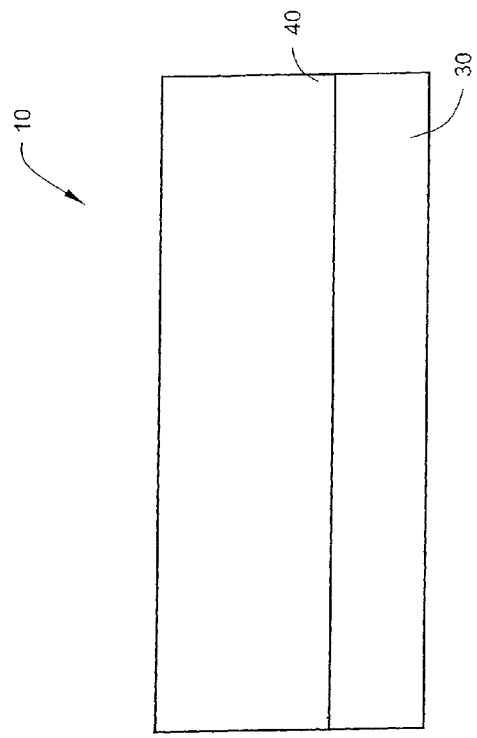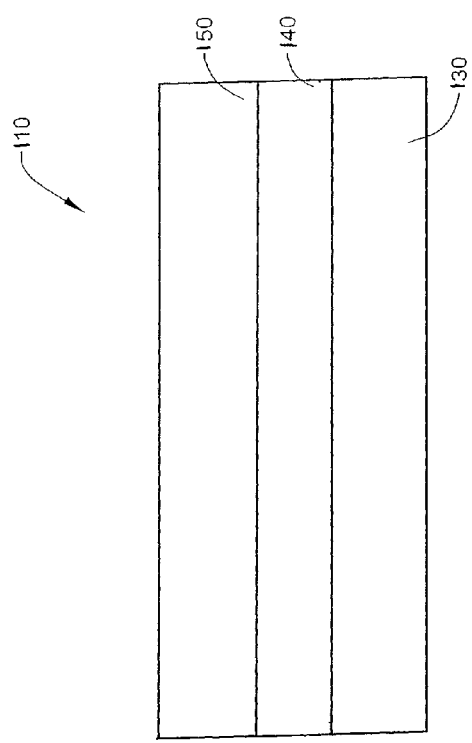

CRYSTALLOGRAPHICALLY ORIENTATED TANTALUM PENTOXIDE AND METHODS OF MAKING SAME

BACKGROUND

The scaling down of integrated circuit devices has created a need to incorporate high dielectric constant (i.e., high dielectric permittivity) materials into capacitors and gates. The search for new high dielectric constant materials and processes is becoming more important as the minimum size for current technology is practically constrained by the use of standard dielectric materials.

Tantalum pentoxide (e.g., $Ta_2O_5$) has found interest as a high dielectric permittivity material for applications such as DRAM capacitors because of its high dielectric constant (e.g., 30) and low leakage currents. Even further interest has been directed to crystalline tantalum pentoxide for such applications, because thin films of crystalline tantalum pentoxide have dielectric constants of 60, which is about twice the dielectric constant of thin films of amorphous tantalum pentoxide. However, some high dielectric constant materials have other properties that may be improved, which may lead to improved performance of the materials and articles incorporating such materials.

New methods of preparing the high dielectric constant materials and new articles having high dielectric constant materials are being sought for current and new generations of devices (e.g., integrated circuit devices).

BRIEF DESCRIPTION OF THE DRAWING

FIG. 1 is a schematic side view illustrating an embodiment of a construction having tantalum pentoxide on at least a portion of a ruthenium-containing material as further described in the present disclosure.

FIG. 2 is a schematic side view illustrating an embodiment of a construction having two tantalum pentoxides, the tantalum pentoxides having different crystallographic orientations, on at least a portion of a ruthenium-containing material as further described in the present disclosure.

Figure 3:
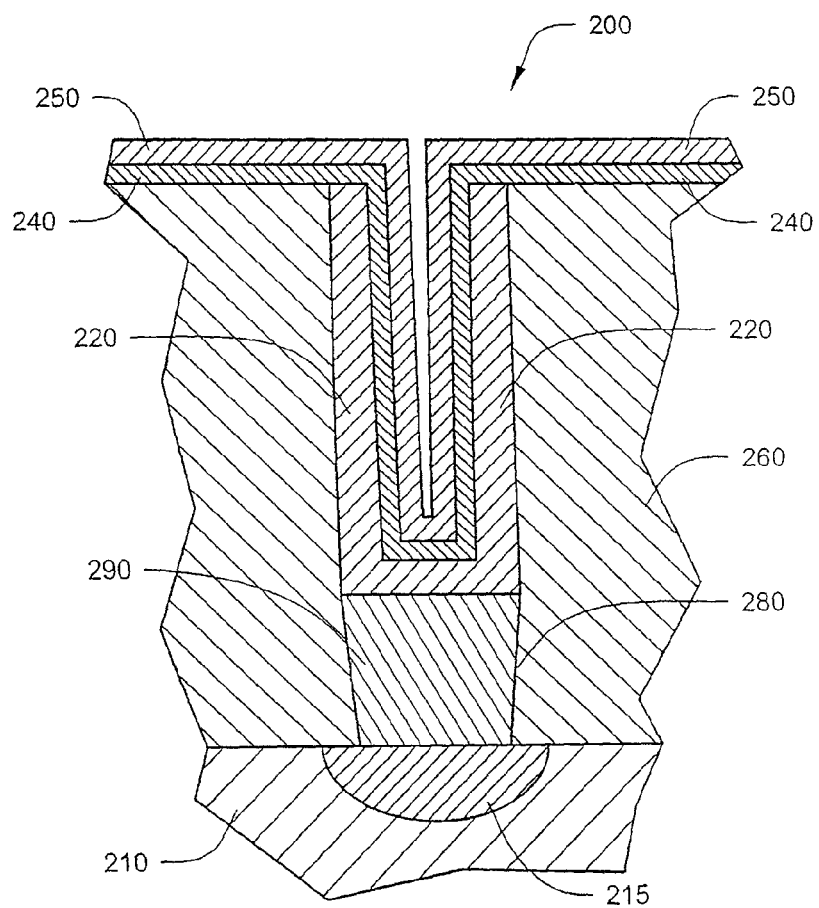
FIG. 3 is a schematic side view illustrating an example capacitor construction having tantalum pentoxide (e.g., tantalum pentoxide dielectric material or layer) on at least a portion of a ruthenium-containing electrode as further described in the present disclosure.

The following description of various embodiments of the articles and methods as described herein is not intended to describe each embodiment or every implementation of such methods. Rather, a more complete understanding of the methods as described herein will become apparent and appreciated by reference to the following description and claims in view of the accompanying drawing. Further, it is to be understood that other embodiments may be utilized and structural changes may be made without departing from the scope of the present disclosure.

DETAILED DESCRIPTION OF ILLUSTRATIVE EMBODIMENTS

Polycrystalline materials generally contain a plurality of individual crystals, or grains, separated by grain boundaries. Such grains retain the characteristic structure of a crystal, but may be differently oriented with respect to neighboring crystals (e.g. grains) by a relative rotation of their principal axes. Grain boundaries in polycrystalline materials may negatively affect, for example, physical and electrical properties of the material. When grain boundaries align, some properties may be even further negatively affected. Although some crystalline (e.g. polycrystalline) dielectric materials exhibit high dielectric constants, the grain boundary alignment in such materials may negatively impact the performance of the dielectric material and the device incorporating the material. For example, grain boundary alignment in a dielectric material may result in increased grain boundary induced leakage, in which current may leak through an insulating dielectric material subjected to an applied electric field. Therefore, a reduction in grain boundary alignment and, therefore, grain boundary induced leakage in crystalline high dielectric constant materials, may provide new articles, constructions, and devices. Such articles, constructions, and devices may be useful in, for example, consumer products applications, electronics applications, semiconductor device applications, capacitor applications, and others.

Provided herein are methods of forming an oxide (e.g., $Ta_2O_5$). Also provided herein are articles and devices including tantalum pentoxides having differing crystallographic orientations.

One aspect of the present disclosure is a method of forming an oxide. The method includes contacting a ruthenium-containing material with a first vapor that includes a tantalum-containing precursor. The method further includes providing a water vapor generator that includes one or more inlet streams and an outlet stream. The outlet stream includes, for example, water and optionally molecular hydrogen ($H_2$). The method further includes contacting the ruthenium-containing material with the outlet stream under conditions effective to form crystalline tantalum pentoxide thereon. As used herein, "a," "an," "the," "at least a," and "at least one" are used interchangeably and mean one or more than one.

A water vapor generator (WVG), in some embodiments, uses a catalyst for reacting one or more inlet streams that include molecular hydrogen ($H_2$) and molecular oxygen ($O_2$) to generate an outlet stream including water vapor. The one or more inlet streams can include, for example, a hydrogen-containing inlet stream and an oxygen-containing inlet stream. In some embodiments, the hydrogen-containing inlet stream can include, for example, molecular hydrogen ($H_2$), atomic hydrogen (H), forming gas ($N_2/H_2$), ammonia ($NH_3$), hydrocarbons (e.g., $CH_4$), alcohols (e.g., $CH_3OH$), or combinations thereof. In some embodiments, the oxygen-containing inlet stream can include, for example, molecular oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), or combinations thereof. In one or more embodiments, the hydrogen-containing inlet stream and the oxygen-containing inlet stream include molecular hydrogen ($H_2$) and molecular oxygen ($O_2$), respectively. A catalyst for a water vapor generator system can include a metal such as palladium, platinum, nickel, iron, chromium, ruthenium, rhodium; alloys thereof; or combinations thereof. Water vapor generators are described, for example, in International Application Publication Nos. WO 2005/113852 (Myo et al.) and WO 2005/117087 (Narwankar et al.). Water vapor generators are available under the trade designations CATALYTIC STEAM GENERATION SYSTEM from Ultra Clean Technology (Menlo Park, Calif.) and WATER VAPOR GENERATOR from Fujikin of America, Inc. (Santa Clara, Calif.).

The hydrogen-containing inlet stream and the oxygen-containing inlet stream can each be controlled independently of the other with, for example, mass flow controllers. Therefore, when the hydrogen and oxygen are introduced to the water vapor generator in a hydrogen-to-oxygen atomic ratio of 2:1, the water vapor generator outlet vapor is water vapor, generally of ultra high purity and reduced contamination relative to pyrogenic steam systems. Unwanted contamination of the steam can result in the contamination of the substrate surface. If the hydrogen-to-oxygen ratio differs from a 2:1 ratio, then excess oxygen or excess hydrogen may be present in the water vapor generator outlet vapor. As used herein, the term "or" is generally employed in the sense as including "and/or" unless the context of the usage clearly indicates otherwise.

The ability to control the hydrogen-to-oxygen ratio in the one or more inlet streams to the water vapor generator may be useful in some embodiments of the present disclosure. In some embodiments, modifying the hydrogen-to-oxygen ratio for one or more inlet streams of the water vapor generator may allow for selective formation (e.g., deposition) of materials having particular crystallographic orientations. In some embodiments, modifying the hydrogen-to-oxygen ratio during deposition may allow deposition of a given material (e.g., tantalum pentoxide) with a particular crystallographic orientation followed by deposition of the same material with a different crystallographic orientation. In this manner, it may be possible to affect grain boundary alignment of the combined material (e.g., dielectric material or layer) and thereby reduce grain boundary induced leakage of the material.

Controlling the hydrogen-to-oxygen ratio for the one or more inlet streams of the water vapor generator may be accomplished in many ways. For example, the hydrogen-to-oxygen ratio may be controlled by employing independent flow rate controllers on each of the hydrogen and oxygen sources. Other methods of controlling the hydrogen-to-oxygen ratio will be apparent to one of ordinary skill in the art, depending on the available hydrogen and oxygen sources and apparatus employed.

Use of a water vapor generator may provide additional operational freedom in vapor deposition processes as compared to use of a water ampoule in some embodiments. A water ampoule evaporates water in a constant and nonvariable atomic ratio of hydrogen-to-oxygen. Controlling the flow rates of hydrogen and oxygen to the water vapor generator allows a variable atomic ratio of hydrogen-to-oxygen in the water vapor generator outlet vapor, which may optionally contain, in addition to water, excess hydrogen or excess oxygen.

Water vapor generators may permit non-stoichiometric ratios of hydrogen and oxygen for the one or more inlet streams (e.g., hydrogen-to-oxygen atomic ratio not equal to two), but may also have limitations on the hydrogen-to-oxygen ratio due to operational safety concerns. In one or more embodiments in the present disclosure, the hydrogen-to-oxygen atomic ratio for the one or more inlet streams of the water vapor generator may be at least 6:3. Further, the hydrogen-to-oxygen atomic ratio for the one or more inlet streams of the water vapor generator may be at most 8:3. Any hydrogen-to-oxygen atomic ratio of at least 6:3 and at most 8:3 may be used (e.g., 6.1, 6.2, 6.4, 6.67, 6.8, 6.9, 7.0, 7.1, 7.2, 7.33, 7.4, 7.6, 7.8, or 7.9 parts hydrogen per 3 parts oxygen on an atomic basis). As used herein, the recitations of numerical ranges by endpoints include all numbers subsumed within that range (e.g., 1 to 5 includes 1, 1.5, 2, 2.75, 3, 3.80, 4, 5, etc.). Typically, the hydrogen-to-oxygen atomic ratios for the one or more inlet streams and the outlet stream of the water vapor generator are substantially the same.

A method of forming an oxide, according to the present disclosure, may include contacting a ruthenium-containing material with a vapor that includes a tantalum-containing precursor. The method may further include providing a water vapor generator that includes one or more inlet streams and an outlet stream, wherein the one or more inlet streams include hydrogen and oxygen and wherein the hydrogen-to-oxygen ratio in the one or more inlet streams is controllable. The method may even further include contacting the ruthenium-containing material with the outlet stream under conditions effective to form crystalline tantalum pentoxide thereon.

The hydrogen-to-oxygen ratio of the one or more inlet streams feeding the water vapor generator may be controlled, as further discussed herein. Therefore, in addition to water, the outlet stream may also include hydrogen. When the hydrogen-to-oxygen atomic ratio of the inlet stream exceeds 6:3, hydrogen in excess of the stoichiometric amount required for water vapor generation will pass through the water vapor generator to the outlet stream.

In one or more embodiments described herein, a vapor deposition process may be used. In such embodiments, the vapor deposition process may accomplish the contacting of the ruthenium-containing material (e.g., a surface of the ruthenium-containing material) with one or more vapors, wherein each vapor may include one or more of the following: a tantalum-containing precursor, a reaction gas (e.g., water), an inert gas, or other gases. In one or more embodiments of the present disclosure, conditions effective to form tantalum pentoxide may include a temperature for a surface of the ruthenium-containing material of 400° C. to 500° C., or in some embodiments 400° C. to 450° C. A vapor deposition process may accomplish contacting the ruthenium-containing material with the outlet stream from a water vapor generator. Further, the vapor deposition process may be an atomic layer deposition process that includes a plurality of deposition cycles.

As discussed herein, the hydrogen-to-oxygen ratio of the inlet stream to the water vapor generator may be controlled. It is therefore possible to change the hydrogen-to-oxygen ratio during a plurality of deposition cycles. For example, during one or more deposition cycles during the plurality of deposition cycles, a first hydrogen-to-oxygen ratio may be used. Subsequently, a second hydrogen-to-oxygen ratio, different than the first hydrogen-to-oxygen ratio, may be used during one or more of the remaining deposition cycles.

Methods of the present disclosure may include one or more changes in the hydrogen-to-oxygen ratio, wherein each change may be of any magnitude. For example, for every 3 parts oxygen, the change may be at least 0.01 parts hydrogen, at least 0.1 parts hydrogen, at least 0.5 parts hydrogen, or at least 1 part hydrogen, using an atomic basis. The change may be less than or equal to the maximum change in hydrogen-to-oxygen ratio as allowed by the water vapor generator operating limits. For example, for every 3 parts oxygen, the change may be less than or equal to 2.0 parts hydrogen, 1.9 parts hydrogen, 1.5 parts hydrogen, or 1.1 parts hydrogen, using an atomic basis. A change in the hydrogen-to-oxygen ratio, for example, may occur once or more during the plurality of deposition cycles.

When a hydrogen-to-oxygen ratio is held constant during a number of consecutive deposition cycles, the crystalline tantalum pentoxide formed may have a first crystallographic orientation. It is therefore possible in one or more embodiments to selectively form crystalline tantalum pentoxide having a particular crystallographic orientation by selecting a particular hydrogen-to-oxygen ratio in the inlet stream to the water vapor generator. For example, using a constant 6:3 atomic ratio of hydrogen-to-oxygen in the inlet stream to the water vapor generator, the crystallographic orientation of the crystalline tantalum pentoxide may be c-axis oriented (i.e., (003) and (006) Miller indices). Alternatively, a constant 8:3 atomic ratio of hydrogen-to-oxygen in the inlet stream to the water vapor generator may result in crystalline tantalum pentoxide that has an orientation such as (200). In embodiments of the present disclosure that include use of at least two hydrogen-to-oxygen ratios, the tantalum pentoxide formed using the first hydrogen-to-oxygen ratio may have a crystallographic orientation different than the crystallographic orientation of the tantalum pentoxide formed using the second hydrogen-to-oxygen ratio.

The difference in orientation between the first and second tantalum pentoxides may affect the grain boundary alignment of a crystalline (e.g., polycrystalline) tantalum pentoxide. Affecting the grain boundary alignment may result in reduced grain boundary induced leakage in the combined tantalum pentoxide. One or both of the first and second crystalline tantalum pentoxides may be crystallographically textured in a single orientation. Moreover, one or both of the first and second crystalline tantalum pentoxides may include more than one crystallographic orientation that is not present in the other crystalline tantalum pentoxide. In such cases, the change in orientations between the two materials may affect the grain boundary alignment and may thereby reduce the grain boundary induced leakage current.

The orientation of a crystalline material (e.g., tantalum pentoxide) may be designated with Miller indices, a system of notation of crystallographic directions and planes. An explanation of Miller indices may be found in Kingery et al., "Introduction to Ceramics," Second Edition, John Wiley & Sons, New York, N.Y., 1976, pages 44-56. For example, the c-axis oriented crystalline tantalum pentoxide may be represented by Miller indices as (003) and/or (006). Other crystallographic orientations for the crystalline tantalum pentoxide include, but are not limited to, the (200), (203), (220), and (102) orientations and other orientations.

Crystallographic orientations of many materials may be identified using x-ray diffraction techniques. X-ray diffraction of thin crystalline materials (e.g., thin films or layers) may be accomplished by grazing incidence x-ray diffraction (GIXRD). Such diffraction techniques result in a plot of intensity versus a 2-theta value. Using Bragg's Law, $n\lambda=2d \sin \theta$, and knowing the order of the diffracted beam, n, the wavelength of the incident x-ray beam, $\lambda$, and the angle of incidence of the x-ray beam, $\theta$, one can calculate the distance between parallel planes of atoms (d-spacings) of a crystal lattice. Such d-spacings correspond to particular crystallographic orientations, depending on the subject material.

It should be noted that crystalline tantalum pentoxide may be polycrystalline. That is, crystalline tantalum pentoxide may have more than one crystallographic orientation. In such cases, within the present disclosure, when a particular crystallographic orientation (e.g., (003)) is mentioned, such a crystallographic orientation is meant to be broadly interpreted to include monocrystalline materials having that crystallographic orientation and also polycrystalline materials predominantly having that orientation, wherein the predominant orientation is determined from the 2-theta value at which the highest intensity peak is located on an x-ray diffraction scan. Peaks of lesser intensity may indicate other crystallographic orientations that may be present to a lesser extent. Further, some peaks may not be distinguishable from background noise rendering such orientations as nondetectable.

It should be noted that a particular hydrogen-to-oxygen ratio need not result in a singular crystallographic orientation of the formed crystalline tantalum pentoxide. Although a predominant orientation may be present, the tantalum pentoxide may be polycrystalline having more than one crystal orientation discernible by x-ray diffraction analysis.

As mentioned above, different crystallographic orientations of crystalline tantalum pentoxide may be formed with different hydrogen-to-oxygen ratios in the inlet stream to the water vapor generator. In some embodiments, crystalline tantalum pentoxides having different crystallographic orientations may be formed during a plurality of deposition cycles. For example, a plurality of deposition cycles may include b+c deposition cycles. During the first b cycles at a first hydrogen-to-oxygen ratio in the inlet to the water vapor generator, a first crystalline tantalum pentoxide may be formed having a first crystallographic orientation. Then the hydrogen-to-oxygen ratio could be changed and subsequently held constant at a second hydrogen-to-oxygen ratio during c additional cycles in order to form a second crystalline tantalum pentoxide having a second crystallographic orientation. The second crystallographic orientation may differ from the first crystallographic orientation. The two differently oriented crystalline tantalum pentoxides may form two parts of an article (e.g., a device).

As used in the present disclosure, materials having different crystallographic orientations are meant to broadly include materials in which the x-ray diffraction scans indicate differing relative proportions of crystallographic orientations. Thus, materials having different crystallographic orientations include materials having different predominant crystallographic orientations, as well as materials having the same predominant crystallographic orientation.

In certain embodiments, articles as disclosed herein can include a first crystalline tantalum pentoxide and a second crystalline tantalum pentoxide on at least a portion of the first tantalum pentoxide, wherein the first tantalum pentoxide has a crystallographic orientation that is different than the crystallographic orientation of the second tantalum pentoxide. In one or more embodiments, the first and second crystalline tantalum pentoxides may be in direct contact with each other. In other words, the first crystalline tantalum pentoxide may be directly on the second crystalline tantalum pentoxide. In one or more embodiments, one or both of the first and second crystalline tantalum pentoxides may form a layer (e.g., a thin film). One of the crystalline tantalum pentoxides may be a dielectric material in an article. In embodiments in which the first and second crystalline tantalum pentoxides are in direct contact, the tantalum pentoxides may be a dielectric material (e.g., a dielectric layer). In some embodiments in which first and second crystalline tantalum pentoxides are in direct contact, the combination may have a high dielectric constant and may have reduced grain boundary induced leakage as compared with crystalline tantalum pentoxide having a single crystallographic orientation and equivalent thickness.

In certain embodiments, articles as disclosed herein can be a dielectric component in a capacitor or a component in a device that includes a capacitor. The article may be a component of, for example, a semiconductor device or a memory device, such as a DRAM device.

In certain embodiments, articles as disclosed herein can include a first electrode that includes a ruthenium-containing material. The article may further include a first crystalline tantalum pentoxide on at least a portion of the first electrode, wherein the first crystalline tantalum pentoxide has a first crystallographic orientation. The article may also include a second crystalline tantalum pentoxide on at least a portion of the first crystalline tantalum pentoxide, wherein the second crystalline tantalum pentoxide has a second crystallographic orientation that is different than the first crystallographic orientation. Such an article may further include a second electrode on at least a portion of the second crystalline tantalum pentoxide. The second electrode may also include a ruthenium-containing material (e.g., ruthenium metal).

An article having at least two differently oriented crystalline tantalum pentoxides that are on an electrode may be a component of a capacitor device. Such an article on or between two electrodes may be a component in, for example, a capacitor device or may be a capacitor device. Such articles may have applications in, for example, semiconductor devices, memory devices (e.g., DRAM chips), and other devices in which capacitors may useful.

In some embodiments, crystalline tantalum pentoxide has a hexagonal close-packed crystalline structure (e.g., a hexagonal phase). For example, tantalum pentoxide may be formed on or directly on a ruthenium-containing material having a hexagonal close-packed structure in order to form crystalline tantalum pentoxide, as-deposited and/or after annealing. In some embodiments, the tantalum pentoxide may be as-deposited crystalline. Optionally, the hexagonal close-packed crystalline tantalum pentoxide may be crystallographically textured. Specifically, the crystalline tantalum pentoxide may be crystallographically textured in the c-axis orientation (i.e., c-axis textured). Crystalline tantalum pentoxide may also be a-axis crystallographically textured ((200) orientation) or may be crystallographically textured in other orientations, such as (203), (220), or (102).

In an article that includes a first crystalline tantalum pentoxide having a first crystallographic orientation and a second crystalline tantalum pentoxide having a second crystallographic orientation that is different than the first crystallographic orientation, at least one of the crystalline tantalum pentoxides may have the (003) or (006) crystallographic orientation. In one or more embodiments, at least one of the first or second crystalline tantalum pentoxides may have the (200) crystallographic orientation. At least one of the crystalline tantalum pentoxides may have an orientation with Miller indices of (203), (220), or (102).

A method of forming an oxide, according to the present disclosure, may include contacting a ruthenium-containing material with a vapor that includes a tantalum-containing precursor. The method may further include contacting the ruthenium-containing material with a second vapor that includes hydrogen and water under conditions effective to form crystalline tantalum pentoxide thereon. In such a method, the tantalum-containing precursor, ruthenium-containing material, and crystalline tantalum pentoxide are as described herein.

In some embodiments, the second vapor that includes hydrogen and water may be the outlet stream of a water vapor generator, wherein the inlet stream to the water vapor generator contains hydrogen in excess of the stoichiometric ratio of hydrogen-to-oxygen required to generate water. Alternatively, for example, an inlet stream having a stoichiometric ratio of hydrogen and oxygen may be fed to the water vapor generator and some additional hydrogen may be added to the outlet stream from the water vapor generator. Other methods of making a second vapor that includes hydrogen and water vapor will be apparent to one of ordinary skill in the art.

Crystalline tantalum pentoxide formed on a ruthenium-containing material can be crystallographically textured (e.g., c-axis textured). As used herein, "texture" or "textured" generally refers to the crystallographic orientation of the crystalline material being discussed, and is not to be confused with the surface smoothness of the crystalline material.

In certain embodiments, at least a portion of the ruthenium-containing material is crystalline (e.g., polycrystalline) and has a hexagonal close-packed crystalline structure. Additionally, at least a portion of the ruthenium-containing material may be crystallographically textured. The ruthenium-containing material may also be crystallographically textured in the c-axis orientation (i.e., c-axis textured).

In some embodiments, the ruthenium-containing material may be pure ruthenium (i.e., ruthenium metal). In other embodiments, the ruthenium-containing material may, in addition to ruthenium, contain other elements, including, but not limited to, oxygen. Ruthenium metal may also be crystalline having a hexagonal close-packed structure. Further, ruthenium metal may also be c-axis textured.

The ruthenium-containing materials in embodiments described herein may be of any shape or size. Some ruthenium-containing materials are ruthenium-containing layers which may or may not be a blanket film. As used herein, a blanket film may be any unpatterned deposition that may coat a portion of a substrate surface up to and including an entire substrate surface. In certain embodiments, the ruthenium-containing material can be a layer having a thickness of from 100 Å to 300 Å, although the thickness can be selected as desired from within or outside this range depending on the particular application. Some ruthenium-containing materials may have more aggressive topologies. For example, the ruthenium-containing material may, as part of the substrate, take the form of one or more cavities, cylinders, containers, vias, stacks, and other semiconductor features, and combinations thereof.

The ruthenium-containing material as described herein may be used in a wide variety of applications where crystalline tantalum pentoxide may be formed thereon. For example, the ruthenium-containing material may be a part of a substrate, semiconductor substrate or substrate assembly. Optionally, the ruthenium-containing material may be used as one or more electrodes in capacitor or gate applications. Specifically, the ruthenium-containing material may be one or more electrodes as a part or parts of a semiconductor device, such as a DRAM capacitor. In some embodiments, the ruthenium-containing material is a bottom electrode in a capacitor construction.

Typically, ruthenium-containing materials are prone to oxidation. The ruthenium-containing surface in most embodiments includes at least one oxygen-containing surface. The oxygen-containing surface may also contain other elements including, but not limited to, ruthenium. The oxygen-containing surface may include ruthenium oxide, $RuO_x$, (e.g., $RuO_2$). In some embodiments, oxidation of at least a portion of the ruthenium-containing material can occur before, during, and/or after forming crystalline tantalum pentoxide thereon, to form ruthenium oxide on at least a portion of the surface.

The nucleation of a textured crystalline tantalum pentoxide on a ruthenium-containing material is very sensitive to the surface of the ruthenium-containing material. Specifically, a significant level of oxygen in an oxygen-containing surface of a ruthenium-containing material may cause difficulty in forming crystallographically textured crystalline tantalum pentoxide thereon (see, for example, Cho et al., *Microelectronic Engineering*, 80:317-320 (2005)). On an atomic concentration basis, a concentration of 40 atomic percent or greater of oxygen in the oxygen-containing surface would likely cause difficulty in nucleating a crystalline tantalum pentoxide layer thereon. On the other hand, a reduction of oxygen concentration in the oxygen-containing surface to 20 atomic percent or less allows nucleation of a crystalline tantalum pentoxide which may optionally be crystallographically textured.

In order to form crystalline tantalum pentoxide on a ruthenium-containing material with at least one oxygen-containing surface, it is desirable to remove at least some of the oxygen from the oxygen-containing surface. This can be accomplished by contacting the oxygen-containing surface with a treating composition under conditions effective to remove at least some oxygen. Such treating compositions include, for example, water, and methods for removing at least some oxygen from an oxygen-containing surface of a ruthenium-containing material are disclosed in U.S. patent application Ser. No. 11/958,952, filed on 18 December 2007 (Bhat et al.) (now U.S. Patent Publication No. 2009/0155486). In the present disclosure, such methods disclosed therein may be used to prepare a surface of a ruthenium-containing material in order to remove at least some oxygen therefrom prior to forming crystalline tantalum pentoxide thereon.

Some embodiments allow the removal of oxygen and contacting to form crystalline tantalum pentoxide to occur in situ. In such embodiments, the methods to remove at least some oxygen from the surface of the ruthenium-containing material and the forming of crystalline tantalum pentoxide thereon may occur in the same deposition chamber. Optionally, in other embodiments, the removal of oxygen and forming tantalum pentoxide may occur ex situ. In such embodiments, the ruthenium-containing material may be moved between the removal of oxygen and forming of tantalum pentoxide, including movement to one or more other deposition chambers.

As mentioned above, the hydrogen-to-oxygen ratio in the inlet stream to the water vapor generator may be controlled, allowing, for example, excess hydrogen or oxygen to pass through the water vapor generator and contact the surface of the ruthenium-containing material. However, because of the tendency for the surface of a ruthenium-containing material to oxidize, thereby causing difficulty in forming crystalline tantalum pentoxide thereon, the hydrogen-to-oxygen ratio may be controlled to avoid introduction of excess oxygen to the surface of the ruthenium-containing material.

Formation of crystalline tantalum pentoxide provides a material with a dielectric constant useful in any application in which high-k constant materials are desired. In particular, crystalline tantalum pentoxide can be used as a dielectric material, especially as one or more dielectric layers on substrates, semiconductor substrates, and substrate assemblies. Crystalline tantalum pentoxide, as a high-k constant material, is also useful as one or more dielectric parts of a semiconductor device, such as a capacitor or gate in a DRAM cell. In certain embodiments, the crystalline tantalum pentoxide has a dielectric constant of 40 to 10. In other certain embodiments, the crystalline tantalum pentoxide layer has a dielectric constant of at least 50. In certain embodiments, the crystalline tantalum pentoxide (e.g., crystalline tantalum pentoxide material or layer) may have a thickness of 50 Å (angstroms) to 200 Å, although the thickness can be selected from within or outside this range depending on the particular application. For example, the thickness of the crystalline tantalum pentoxide may be 50 Å to 150 Å or 90 Å to 150 Å. In embodiments in which a first crystalline tantalum pentoxide having a first crystallographic orientation is formed on or in direct contact with a second crystalline tantalum pentoxide having a second crystallographic orientation, each of the first and second crystalline tantalum pentoxides (e.g., materials or layers) may have any thickness, but at most 150 Å (e.g., 50 Å to 150 Å or 50 Å to 90 Å), and the combined thickness may be at most 150 Å, although the thickness of each crystalline tantalum pentoxide, as well as the combined thickness, can be selected from within or outside this range depending on the particular application.

In some embodiments, the crystalline tantalum pentoxide is formed on a blanket film topology. In other embodiments, the crystalline tantalum pentoxide may be formed on an aggressive topology, such as on a DRAM cell having one or more features including, but not limited to, stacks, cylinders, containers, and openings. The crystalline tantalum pentoxide may be formed in a layer, such as a dielectric layer. The crystalline tantalum pentoxide formed may be any size useful for a dielectric device.

The crystalline tantalum pentoxide formed in most embodiments is tantalum pentoxide in the substantial absence of impurities. As used herein, the "substantial absence" of impurities means that no more than insignificant amounts of impurities (e.g., less than 1 atomic percent) might be present in the crystalline tantalum pentoxide.

Formation of an amorphous tantalum pentoxide may be followed by annealing lasting one or more time periods of 0.5 minutes to 2 hours and frequently involving temperatures of 500° C. to 1000° C. In one or more embodiments, methods of the present disclosure do not include annealing. As-deposited crystalline tantalum pentoxide may be formed on the surface of a ruthenium-containing material. That is, the tantalum pentoxide may be formed in a crystalline structure, not in an amorphous state. Thus, in one or more embodiments of the present disclosure, one or more crystalline tantalum pentoxides (e.g., first and second crystalline tantalum pentoxides) may be formed without annealing. Further, in other embodiments, the as-deposited crystalline tantalum pentoxide may be as-deposited crystallographically textured crystalline tantalum pentoxide, such as in the c-axis orientation (i.e., c-axis textured). When no annealing is required to crystallize the formed tantalum pentoxide, the temperature of the surface (e.g., the surface of the ruthenium-containing material) on which the crystalline tantalum pentoxide is formed may remain less than or equal to 500° C., and in some embodiments less than or equal to 450° C. When no annealing is required to crystallize the formed tantalum pentoxide, the temperature of the surface (e.g., the surface of the ruthenium-containing material) on which the crystalline tantalum pentoxide is formed may remain greater than or equal to 375° C., and in some embodiments greater than or equal to 400° C.

Tantalum pentoxide can be deposited on a surface of a ruthenium-containing material having a hexagonal close-packed structure to form crystalline tantalum pentoxide (e.g., crystalline tantalum pentoxide material or layer). Such constructions having ruthenium-containing materials and crystalline tantalum pentoxides can be useful as portions of, or intermediates for making, capacitors (e.g., DRAM applications), in which an electrode includes a ruthenium-containing material and the crystalline tantalum pentoxide forms a dielectric layer. The electrode including a ruthenium-containing material may have a blanket film topology or may have a more aggressive topology, such as DRAM topology. The tantalum pentoxide may be as-deposited crystalline. In certain embodiments, the tantalum pentoxide has a hexagonal structure. In certain embodiments, the tantalum pentoxide (e.g., material or layer) has a dielectric constant of at least 50. Optionally, a second electrode can formed on at least a portion of a crystalline tantalum pentoxide (e.g., tantalum pentoxide dielectric material). The second electrode can include a wide variety of materials known for use as electrodes. For example, such materials can include, but are not limited to, iridium, ruthenium, niobium nitride, tantalum nitride, hafnium nitride, and combinations thereof.

The following examples are offered to further illustrate various specific embodiments and techniques of the present disclosure. It should be understood, however, that many variations and modifications understood by those of ordinary skill in the art may be made while remaining within the scope of the present disclosure. Therefore, the scope of the present disclosure is not intended to be limited by the following examples.

An example construction 10 is schematically illustrated in FIG. 1. Construction 10 includes crystalline tantalum pentoxide 40 on at least a portion of a ruthenium-containing material 30. The ruthenium-containing material 30 can be a layer and can have any suitable thickness. In some embodiments, the ruthenium-containing material 30 has a thickness of 100 Å to 300 Å. In some embodiments, at least the surface of the ruthenium-containing material 30 is ruthenium and has a c-axis crystallographically textured hexagonal close-packed structure. Optionally, construction 10 can include a surface of the ruthenium containing material 30 that includes oxygen (not shown). At least a portion of the oxygen may be removed from the surface of the ruthenium-containing material 30. Construction 10 further includes crystalline tantalum pentoxide 40 on at least a portion of the surface of the ruthenium-containing material 30, having been deposited after at least a portion of the oxygen was removed from surface of the ruthenium-containing material 30. "Layer," as used herein, is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in a technology outside of semiconductor technology, such as coatings on glass. For example, such layers can be formed directly on fibers, wires, etc., which are substrates other than semiconductor substrates. Further, the layers can be formed on (e.g., directly on) the lowest semiconductor surface of the substrate, or they can be formed on any of a variety of layers (e.g., surfaces) as in, for example, a patterned wafer. As used herein, layers need not be continuous, and in certain embodiments are discontinuous. Unless otherwise stated, as used herein, a layer or material "adjacent to" or "on" a surface (or another layer) is intended to be broadly interpreted to include not only constructions having a layer or material directly on the surface, but also constructions in which the surface and the layer or material are separated by one or more additional materials (e.g., layers). As used herein, unless otherwise stated, a first material that is "directly on" and "in direct contact with" a second material is intended to be broadly interpreted to include constructions wherein at least a portion of the first material is in contact with at least a portion of the second material, having no intervening materials between the contacting portions of the two materials.

The ruthenium-containing material 30 can be formed or deposited, for example, on a substrate, (e.g., a semiconductor substrate or substrate assembly), which is not illustrated in FIG. 1. "Semiconductor substrate" or "substrate assembly" as used herein refer to a semiconductor substrate such as a base semiconductor material or a semiconductor substrate having one or more materials, structures, or regions formed thereon. A base semiconductor material is typically the lowest silicon material on a wafer or a silicon material deposited on another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

Suitable substrate materials of the present disclosure include conductive materials, semiconductive materials, conductive metal-nitrides, conductive metals, conductive metal oxides, etc. The substrate can be a semiconductor substrate or substrate assembly. A wide variety of semiconductor materials are contemplated, such as for example, borophosphosilicate glass (BPSG), silicon such as, e.g., conductively doped polysilicon, monocrystalline silicon, etc. (for this disclosure, appropriate forms of silicon are simply referred to as "silicon"), for example in the form of a silicon wafer, tetraethylorthosilicate (TEOS) oxide, spin on glass (i.e., $SiO_2$, optionally doped, deposited by a spin on process), TiN, TaN, W, RU, Al, Cu, noble metals, etc. A substrate assembly may also include a portion that includes platinum, iridium, iridium oxide, rhodium, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, ruthenium-containing material 30 may be formed on or directly on the lowest semiconductor surface of the substrate, or they can be formed on any of a variety of other surfaces as in a patterned wafer, for example.

Substrates other than semiconductor substrates or substrate assemblies can also be used in presently disclosed methods. Any substrate that may advantageously form a ruthenium-containing material 30 thereon may be used, such substrates including, for example, fibers, wires, etc.

Metal-containing materials (e.g., ruthenium-containing materials and/or crystalline tantalum pentoxide-containing materials) as described herein can be formed by a wide variety of deposition methods including, for example, evaporation, physical vapor deposition (PVD or sputtering), and/or vapor deposition methods such as chemical vapor deposition (CVD) or atomic layer deposition (ALD).

Metal-containing precursor compositions can be used to form metal-containing materials (e.g., ruthenium-containing materials and/or tantalum pentoxide-containing materials) in various embodiments described in the present disclosure. As used herein, "metal-containing" is used to refer to a material, typically a compound or a layer, that may consist entirely of a metal, or may include other elements in addition to a metal. Typical metal-containing compounds include, but are not limited to, metals, metal-ligand complexes, metal salts, organometallic compounds, and combinations thereof. Typical metal-containing layers include, but are not limited to, metals, metal oxides, metal nitrides, and combinations thereof.

Various metal-containing compounds can be used in various combinations, optionally with one or more organic solvents (particularly for CVD processes), to form a metal-containing precursor composition. Some of the metal-containing compounds disclosed herein can be used in ALD without adding solvents. "Precursor" and "precursor composition" as used herein, refer to a composition usable for forming, either alone or with other precursor compositions (or reactants), a material on a substrate assembly in a deposition process. Further, one skilled in the art will recognize that the type and amount of precursor used will depend on the content of a material which is ultimately to be formed using a vapor deposition process. In certain embodiments of the methods as described herein, the precursor compositions are liquid at the vaporization temperature, and sometimes liquid at room temperature.

The precursor compositions may be liquids or solids at room temperature, and for certain embodiments are liquids at the vaporization temperature. Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they can be sufficiently soluble in an organic solvent or have melting points below their decomposition temperatures such that they can be used, for example, in flash vaporization, bubbling, microdroplet formation techniques, etc.

Herein, vaporized metal-containing compounds may be used either alone or optionally with vaporized molecules of other metal-containing compounds or optionally with vaporized solvent molecules or inert gas molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as an inert carrier gas.

"Inert gas" or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes as described herein, and in some embodiments may also be used to assist in precursor vapor transport.

Solvents that are suitable for certain embodiments of methods as described herein may be one or more of the following: aliphatic hydrocarbons or unsaturated hydrocarbons (C3-C20, and in certain embodiments C5-C10, cyclic, branched, or linear), aromatic hydrocarbons (C5-C20, and in certain embodiments C5-C10), halogenated hydrocarbons, silylated hydrocarbons such as alkylsilanes, alkylsilicates, ethers, cyclic ethers (e.g., tetrahydrofuran, THF), polyethers, thioethers, esters, lactones, nitrites, silicone oils, or compounds containing combinations of any of the above or mixtures of one or more of the above. The compounds are also generally compatible with each other, so that mixtures of variable quantities of the metal-containing compounds will not interact to significantly change their physical properties.

Methods as described herein use metal precursor compounds. As used herein, a "metal precursor compound" is used to refer to a compound that can provide a source of the metal in an atomic layer deposition method. Further, in some embodiments, the methods include "metal-organic" precursor compounds. The term "metal-organic" is intended to be broadly interpreted as referring to a compound that includes, in addition to a metal, an organic group (i.e., a carbon-containing group). Thus, the term "metal-organic" includes, but is not limited to, organometallic compounds, metal-ligand complexes, metal salts, and combinations thereof.

Methods of making a ruthenium-containing material are well-known in the art. See, for example, U.S. Pat. No. 7,018,675 (Yang), U.S. Pat. No. 6,784,504 (Derderian et al.), and U.S. Pat. No. 6,074,945 (Vaartstra et al.). For example, U.S. Pat. No. 7,018,675 (Yang) discloses a method for forming a ruthenium metal layer that includes providing a ruthenium precursor (e.g., selected from the group consisting of tricarbonyl-1,3-cyclohexadiene ruthenium, bisethylcyclopentadienylruthenium, and ruthenium octanedionate) and oxygen in a chamber to form a ruthenium oxide layer; and heating the ruthenium oxide layer in the presence of a hydrogen-rich gas to convert said ruthenium oxide layer to a smooth-surfaced ruthenium metal layer. For another example, U.S. Pat. No. 6,074,945 (Vaartstra et al.) discloses a method that includes providing a semiconductor substrate or substrate assembly; providing a liquid precursor composition including one or more compounds of the formula: $(diene)Ru(CO)_3$, wherein "diene" refers to linear, branched, or cyclic dienes, bicyclic dienes, tricyclic dienes, derivatives thereof including halide, Si, S, Se, P, As, N, or O heteroatoms, or combinations of said heteroatoms; vaporizing the liquid precursor composition to form vaporized precursor composition; and directing the vaporized precursor composition toward the semiconductor substrate or substrate assembly to form a ruthenium metal film on a surface of the semiconductor substrate or substrate assembly.

Ruthenium-containing materials can be formed from a wide variety of ruthenium-containing precursor compounds using vapor deposition methods. Ruthenium-containing precursor compounds known in the art include, for example, organoruthenium complexes such as bis(cyclopentadienyl) ruthenium $(Ru(C_5H_5)_2)$, and ruthenium carbonyls such as $Ru(CO)_5$, $Ru_2(CO)_9$, $Ru_3(CO)_{12}$, tricarbonyl(1,3-cyclohexadiene)ruthenium, tricarbonyl(cyclopentadienyl)-ruthenium, and combinations thereof as described, for example, in U.S. Pat. Nos. 7,256,123 (Derderian et al.) and 7,262,132 (Marsh), and U.S. Patent Application Publication No. 2005/0238808 (Gatineau et al.). A halogenated ruthenium compound such as ruthenium tetrachloride $(RuCl_4)$, ruthenium trichloride $(RuCl_3)$, ruthenium pentafluoride $(RuF_5)$, or combinations thereof could be used as described, for example, in U.S. Pat. No. 7,256,123 (Derderian et al.).

Crystalline tantalum pentoxides, including tantalum pentoxide-containing layers, can be formed from a wide variety of tantalum-containing precursor compounds using vapor deposition methods. Tantalum-containing precursor compounds known in the art include, for example, tantalum methoxide $(Ta(OMe)_5)$; tantalum ethoxide $(Ta(OEt)_5)$; tantalum butoxide $(Ta(OBu)_5)$; tantalum halides of the formula $TaX_5$ (wherein each X is independently a halide), such as tantalum fluoride $(TaF_5)$, tantalum chloride $(TaCl_5)$, and tantalum iodide $(TaI_5)$; pentakis(dimethylamino)tantalum, tris(diethylamino)(ethylimino)tantalum, tris(diethylamino)(tert-butylimino)tantalum; other tantalum-containing precursor compounds as described in U.S. Pat. No. 7,030,042 B2 (Vaartstra et al.); and combinations thereof.

In certain embodiments, crystalline tantalum pentoxide can be foiled by a vapor deposition method using at least one tantalum-containing precursor compound and optionally at least one reaction gas as described, for example, in U.S. Pat. No. 7,030,042 B2 (Vaartstra et al.). Such crystalline tantalum pentoxide may be formed by contacting at least one tantalum-containing precursor compound and optionally at least one reaction gas on at least a portion of a ruthenium-containing material. In some embodiments, a reaction gas is water vapor, ozone, or combinations thereof.

Precursor compositions as described herein can, optionally, be vaporized and deposited/chemisorbed substantially simultaneously with, and in the presence of, one or more reaction gases. Alternatively, metal-containing materials may be formed by alternately introducing the precursor composition and the reaction gas(es) during each deposition cycle. Such reaction gases can include, for example, oxygen-containing sources, which can be oxidizing gases. A wide variety of suitable oxidizing gases can be used including, for example, oxygen, water vapor, ozone, hydrogen peroxide, alcohols (e.g., isopropanol), and combinations thereof.

The precursor compositions can be vaporized in the presence of an inert carrier gas if desired. Additionally, an inert carrier gas can be used in purging steps in an ALD process (discussed below). The inert carrier gas is typically nitrogen, argon, helium, neon, krypton, xenon, any other non-reactive gas, and mixtures thereof, etc. In the context of the present disclosure, an inert carrier gas is one that does not interfere with the formation of the metal-containing material. Whether done in the presence of an inert carrier gas or not, the vaporization can be done in the absence of oxygen to avoid oxygen contamination (e.g., oxidation of silicon to form silicon dioxide or oxidation of precursor in the vapor phase prior to entry into the deposition chamber).

The terms "deposition process" and "vapor deposition process" as used herein refer to a process in which a metal-containing material is formed on one or more surfaces of a substrate (e.g., a doped polysilicon wafer) from vaporized precursor composition(s) including one or more metal-containing compound(s). Specifically, one or more metal-containing compounds are vaporized and directed to and/or contacted with one or more surfaces of a substrate (e.g., semiconductor substrate or substrate assembly) placed in a deposition chamber. Typically, the substrate is heated. These metal-containing compounds can form (e.g., by reacting or decomposing) a non-volatile, thin, uniform, metal-containing material on the surface(s) of the substrate. For the purposes of this disclosure, the term "vapor deposition process" is meant to include both chemical vapor deposition processes (including pulsed chemical vapor deposition processes) and atomic layer deposition processes.

Chemical vapor deposition (CVD) and atomic layer deposition (ALD) are two vapor deposition processes often employed to form thin, continuous, uniform, metal-containing materials onto semiconductor substrates. Using either vapor deposition process, typically one or more precursor compositions are vaporized in a deposition chamber and optionally combined with one or more reaction gases and directed to and/or contacted with the substrate to form a metal-containing material on the substrate. It will be readily apparent to one skilled in the art that the vapor deposition process may be enhanced by employing various related techniques such as plasma assistance, photo assistance, laser assistance, as well as other techniques.

"Chemical vapor deposition" (CVD) as used herein refers to a vapor deposition process wherein the desired layer is deposited on the substrate from vaporized metal-containing compounds (and any reaction gases used) within a deposition chamber with no effort made to separate the reaction components. In contrast to a "simple" CVD process that involves the substantial simultaneous use of the precursor compositions and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

Chemical vapor deposition (CVD) has been extensively used for the preparation of metal-containing layers, such as dielectric layers, in semiconductor processing because of its ability to provide conformal and high quality dielectric layers at relatively fast processing times. Typically, the desired precursor compositions are vaporized and then introduced into a deposition chamber containing a heated substrate with optional reaction gases and/or inert carrier gases in a single deposition cycle. In a typical CVD process, vaporized precursors are contacted with reaction gas(es) at the substrate surface to form a material (e.g., layer or dielectric layer). The single deposition cycle is allowed to continue until the desired thickness of the layer is achieved.

Typical CVD processes generally employ precursor compositions in vaporization chambers that are separated from the process chamber wherein the deposition surface or wafer is located. For example, liquid precursor compositions are typically placed in bubblers and heated to a temperature at which they vaporize, and the vaporized liquid precursor composition is then transported by an inert carrier gas passing over the bubbler or through the liquid precursor composition. The vapors are then swept through a gas line to the deposition chamber for depositing a layer on substrate surface(s) therein. Many techniques have been developed to precisely control this process. For example, the amount of precursor composition transported to the deposition chamber can be precisely controlled by the temperature of the reservoir containing the precursor composition and by the flow of an inert carrier gas bubbled through or passed over the reservoir.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Several modifications of the CVD chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD but does not rigorously avoid intermixing of precursor and reactant gas streams. Also, for pulsed CVD, the deposition thickness is dependent on the exposure time, as opposed to ALD, which is self-limiting (discussed in more detail below).

The term "atomic layer deposition" (ALD) as used herein refers to a vapor deposition process in which deposition cycles, for example a plurality of consecutive deposition cycles, are conducted in a process chamber (i.e., a deposition chamber). As used herein, a "plurality" means two or more. Typically, during each cycle a precursor is chemisorbed to a deposition surface (e.g., a substrate assembly surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE) (see, for example, U.S. Pat. No. 5,256,244 to Ackerman), molecular beam epitaxy (MBE), gas source MBE, or organometallic MBE, and chemical beam epitaxy when performed with alternating pulses of precursor composition(s), reactive gas, and purge (e.g., inert carrier) gas.

The vapor deposition process employed in some methods of the present disclosure can be a multi-cycle atomic layer deposition (ALD) process. Such a process is advantageous, in particular advantageous over a CVD process, in that it provides for improved control of atomic-level thickness and uniformity to the deposited material (e.g., dielectric layer) by providing a plurality of self-limiting deposition cycles. The self-limiting nature of ALD provides a method of depositing a film on a wide variety of reactive surfaces including, for example, surfaces with irregular topographies, with better step coverage than is available with CVD or other "line of sight" deposition methods (e.g., evaporation and physical vapor deposition, i.e., PVD or sputtering). Further, ALD processes typically expose the metal-containing compounds to lower volatilization and reaction temperatures, which tend to decrease degradation of the precursor as compared to, for example, typical CVD processes.

Generally, in an ALD process each reactant is pulsed onto a suitable substrate, typically at deposition temperatures of at least 25° C., in certain embodiments at least 150° C., and in other embodiments at least 200° C. Typical ALD deposition temperatures are less than or equal to 400° C., in certain embodiments less than or equal to 350° C., and in other embodiments less than or equal to 250° C. These temperatures are generally lower than those presently used in CVD processes, which typically include deposition temperatures at the substrate surface of at least 150° C., in some embodiments at least 200° C., and in other embodiments at least 250° C. In most embodiments, CVD deposition temperatures are less than or equal to 500° C., in certain embodiments less than or equal to 450° C., and in other embodiments less than or equal to 400° C.

A typical ALD process includes exposing a substrate (which may optionally be pretreated with, for example, water and/or ozone) to a first chemical to accomplish chemisorption of the chemical onto the substrate. The term "chemisorption" as used herein refers to the chemical adsorption of vaporized reactive metal-containing compounds on the surface of a substrate. The adsorbed chemicals are typically irreversibly bound to the substrate surface as a result of relatively strong binding forces characterized by high adsorption energies (e.g., >30 kcal/mol), comparable in strength to ordinary chemical bonds. The chemisorbed chemicals typically form a monolayer on the substrate surface. (See, for example, "The Condensed Chemical Dictionary," 10th edition, revised by G. G. Hawley, published by Van Nostrand Reinhold Co., New York, 225 (1981)). In ALD one or more appropriate precursor compositions or reaction gases are alternately introduced (e.g., pulsed) into a deposition chamber and chemisorbed onto the surfaces of a substrate. Each sequential introduction of a reactive compound (e.g., one or more precursor compositions and one or more reaction gases) is typically separated by an inert carrier gas purge to provide for deposition and/or chemisorption of a second reactive compound in the substantial absence of the first reactive compound. As used herein, the "substantial absence" of the first reactive compound during deposition and/or chemisorption of the second reactive compound means that no more than insignificant amounts of the first reactive compound might be present. According to the knowledge of one of ordinary skill in the art, a determination can be made as to the tolerable amount of the first reactive compound, and process conditions can be selected to achieve the substantial absence of the first reactive compound.

Each precursor composition co-reaction adds a new atomic layer to previously deposited layers to form a cumulative solid. The cycle is repeated to gradually form the desired thickness. It should be understood that ALD can alternately utilize one precursor composition, which is chemisorbed, and one reaction gas, which reacts with the chemisorbed precursor composition.

A typical ALD process includes exposing an initial substrate to a first chemical A (e.g., a precursor composition such as a metal-containing compound as described herein or a reaction gas), to accomplish chemisorption of chemical A onto the substrate. Chemical A can react either with the substrate surface or with chemical B (described below), but not with itself. When chemical A is a metal-containing compound having ligands, one or more of the ligands is typically displaced by reactive groups on the substrate surface during chemisorption. Theoretically, the chemisorption forms a monolayer that is uniformly one atom or molecule thick on the entire exposed initial substrate, the monolayer being composed of chemical A, less any displaced ligands. In other words, a saturated monolayer is substantially formed on the substrate surface.

Substantially all non-chemisorbed molecules of chemical A as well as displaced ligands are purged from over the substrate and a second chemical, chemical B (e.g., a different metal-containing compound or reaction gas) is provided to react with the monolayer of chemical A. Chemical B typically displaces the remaining ligands from the chemical A monolayer and thereby is chemisorbed and forms a second monolayer. This second monolayer displays a surface which is reactive only to chemical A. Non-chemisorbed chemical B, as well as displaced ligands and other byproducts of the reaction are then purged and the steps are repeated with exposure of the chemical B monolayer to vaporized chemical A. Optionally, chemical B can react with chemical A, but not chemisorb additional material thereto. That is, chemical B can cleave some portion of the chemisorbed chemical A, altering such monolayer without forming another monolayer thereon, but leaving reactive sites available for formation of subsequent monolayers. In other ALD processes, a third or more chemicals may be successively chemisorbed (or reacted) and purged just as described for chemical A and chemical B, with the understanding that each introduced chemical reacts with the monolayer produced immediately prior to its introduction. Optionally, chemical B (or third or subsequent chemicals) can include at least one reaction gas if desired.

Practically, chemisorption might not occur on all portions of the deposition surface (e.g., previously deposited ALD material). Nevertheless, such imperfect monolayer is still considered a monolayer in the context of the present disclosure. In many applications, merely a substantially saturated monolayer may be suitable. In one aspect, a substantially saturated monolayer is one that will still yield a deposited monolayer or less of material exhibiting the desired quality and/or properties. In another aspect, a substantially saturated monolayer is one that is self-limited to further reaction with precursor.

The film growth by ALD is typically self-limiting (i.e., when the reactive sites on a surface are depleted in an ALD process, the deposition generally stops), which can provide for substantial deposition conformity within a wafer and deposition thickness control. Due to alternate dosing of the precursor compositions and/or reaction gases, detrimental vapor-phase reactions are inherently diminished, in contrast to the CVD process that is carried out by continuous co-reaction of the precursors and/or reaction gases. (See, for example, Vehkamäki et al., "Growth of $SrTiO_3$ and $BaTiO_3$ Thin Films by Atomic Layer Deposition," Electrochemical and Solid-State Letters, 2(10):504-506 (1999)).

ALD is often described as a self-limiting process, in that a finite number of reactive sites exist on a substrate to which the first chemical may form chemical bonds. The second chemical might only react with the surface created from the chemisorption of the first chemical and thus, may also be self-limiting. Once all of the finite number of reactive sites on a substrate are bonded with a first chemical, the first chemical will not bond to other of the first chemicals already bonded with the substrate. However, process conditions can be varied in ALD to promote such bonding and render ALD not self-limiting, e.g., more like pulsed CVD. Accordingly, ALD may also encompass chemicals forming other than one monolayer at a time by stacking of chemicals, forming a material more than one atom or molecule thick.

Thus, during the ALD process, numerous consecutive deposition cycles can be conducted in the deposition chamber, each cycle depositing a very thin metal-containing layer (usually less than one monolayer such that the growth rate on average is 0.02 to 0.3 nanometers per cycle), until material of the desired thickness is built up on the substrate of interest. The deposition can be accomplished by alternately introducing (i.e., by pulsing) precursor composition(s) into the deposition chamber containing a substrate, chemisorbing the precursor composition(s) as a monolayer onto the substrate surfaces, purging the deposition chamber, then introducing to the chemisorbed precursor composition(s) reaction gases and/or other precursor composition(s) in a plurality of deposition cycles until the desired thickness of the metal-containing material is achieved.

Thus, the use of ALD typically provides the ability to improve the control of thickness, composition, and uniformity of metal-containing materials on a substrate. For example, depositing thin layers of metal-containing compound in a plurality of cycles provides a more accurate control of ultimate film thickness. This is particularly advantageous when precursor composition(s) are directed to the substrate and allowed to chemisorb thereon, optionally further including at least one reaction gas that can react with the chemisorbed precursor composition(s) on the substrate, and in certain embodiments wherein this cycle is repeated at least once.

Purging of excess vapor of each chemical following deposition and/or chemisorption onto a substrate may involve a variety of techniques including, but not limited to, contacting the substrate and/or monolayer with an inert carrier gas and/or lowering pressure to below the deposition pressure to reduce the concentration of a chemical contacting the substrate and/or chemisorbed chemical. Examples of inert carrier gases, as discussed above, may include nitrogen, argon, helium, etc. Additionally, purging may instead include contacting the substrate and/or monolayer with any substance that allows chemisorption by-products to desorb and reduces the concentration of a contacting chemical preparatory to introducing another chemical. The contacting chemical may be reduced to some suitable concentration or partial pressure known to those skilled in the art based on the specifications for the product of a particular deposition process.

The pulse duration of precursor composition(s) and inert carrier gas(es) is generally of a duration sufficient to saturate the substrate surface. Typically, the pulse duration is at least 0.1 seconds, in certain embodiments at least 0.2 second, and in other embodiments at least 0.5 second. Typically pulse durations are generally less than or equal to 2 minutes, and in certain embodiments less than or equal to 1 minute.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed chemical (s) and the underlying substrate surface and to prevent decomposition of the chemical(s) (e.g., precursor compositions). The temperature, on the other hand, must be sufficiently high to avoid condensation of the chemical(s) (e.g., precursor compositions). Typically the substrate is kept at a temperature of at least 25° C., in certain embodiments at least 150° C., and in some embodiments at least 200° C. Typically the substrate is kept at a temperature of less than or equal to 400° C., in certain embodiments less than or equal to 350° C., and in other certain embodiments less than or equal to 300° C., which, as discussed above, is generally lower than temperatures presently used in typical CVD processes. The first chemical or precursor composition can be chemisorbed at a first temperature, and the surface reaction of the second chemical or precursor composition can occur at substantially the same temperature or, optionally, at a substantially different temperature. Clearly, some small variation in temperature, as judged by those of ordinary skill, can occur but still be considered substantially the same temperature by providing a reaction rate statistically the same as would occur at the temperature of the first chemical or precursor chemisorption. Alternatively, chemisorption and subsequent reactions could instead occur at substantially exactly the same temperature.

For a typical vapor deposition process, the pressure inside the deposition chamber can be at least $10^{-8}$ torr ($1.3 \times 10^{-6}$ Pascal, "Pa"), in certain embodiments at least $10^{-7}$ torr ($1.3 \times 10^{-5}$ Pa), and in other certain embodiments at least $10^{-6}$ torr ($1.3 \times 10^{-4}$ Pa). Further, deposition pressures are typically less than or equal to 20 torr ($2.7 \times 10^3$ Pa), in certain embodiments less than or equal to 5 torr ($6.7 \times 10^2$ Pa), and in other certain embodiments less than or equal to 2 torr ($2.7 \times 10^2$ Pa). Typically, the deposition chamber is purged with an inert carrier gas after the vaporized precursor composition(s) have been introduced into the chamber and/or reacted for each cycle. The inert carrier gas/gases can also be introduced with the vaporized precursor composition(s) during each cycle.

The reactivity of a precursor composition can significantly influence the process parameters in ALD. Under typical CVD process conditions, a highly reactive chemical (e.g., a highly reactive precursor composition) may react in the gas phase generating particulates, depositing prematurely on undesired surfaces, producing inadequate films, and/or inadequate step coverage or otherwise yielding non-uniform deposition. For at least such reason, a highly reactive chemical might be considered not suitable for CVD. However, some chemicals not suitable for CVD are superior in precursor compositions for ALD. For example, if the first chemical is gas phase reactive with the second chemical, such a combination of chemicals might not be suitable for CVD, although they could be used in ALD. In the CVD context, concern might also exist regarding sticking coefficients and surface mobility, as known to those skilled in the art, when using highly gas-phase reactive chemicals, however, little or no such concern would exist in the ALD context.

The methods of forming an oxide (e.g., tantalum pentoxide) and articles of the present disclosure may be beneficial for a wide variety of thin film applications in semiconductor structures, particularly those using high dielectric permittivity materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

FIG. 2 illustrates an article 110 having an electrode 130 (e.g., a ruthenium-containing material), a first crystalline tantalum pentoxide 140 on at least a portion of the electrode 130 and having a first crystallographic orientation, and a second crystalline tantalum pentoxide 150 on at least a portion of the first crystalline tantalum pentoxide 140 having a second crystallographic orientation. Article 110 optionally includes a second electrode (not shown) on the second crystalline tantalum pentoxide 150.

The ruthenium-containing material 30, the electrode 130, the crystalline tantalum pentoxide 40, and the first and second crystalline tantalum pentoxides, 140 and 150, are depicted as having uniform thickness. While these materials (e.g., ruthenium-containing materials and/or tantalum pentoxides) may have substantially uniform thickness, materials in the present disclosure may be of nonuniform thickness. For example, some ruthenium-containing material 30 or electrode 130 may contain topographical features (e.g., vias, trenches, etc.) (not shown). Crystalline tantalum pentoxide 40 and first crystalline tantalum pentoxide 140 may be respectively formed on such ruthenium-containing material 30 or electrode 130 having aggressive topology and may fill in such topographical features.

In some embodiments, one or more intermediate or intervening materials may be disposed between, for example, the ruthenium-containing material 30 and the first tantalum pentoxide 40, or between the materials depicted in FIG. 2 (e.g., between the electrode 130 and the first crystalline tantalum pentoxide 140 or between the first crystalline tantalum pentoxide 140 and the second crystalline tantalum pentoxide 150). FIGS. 1, 2, and 3 are not drawn to scale and should not be limited thereby. For example, the thicknesses of the materials (e.g., ruthenium containing materials and tantalum pentoxides) in FIGS. 1 and 2 may be the same or different, without limitation.

FIG. 3 shows an example of the ALD formation of metal-containing layers of the present disclosure as used in an example capacitor construction. Referring to FIG. 3, capacitor construction 200 includes substrate 210 having conductive diffusion area 215 formed therein. Substrate 210 can include, for example, silicon. An insulating material 260, such as BPSG, is provided over substrate 210, with contact opening 280 provided therein to diffusion area 215. Conductive material 290 fills contact opening 280, and may include, for example, tungsten or conductively doped polysilicon. Capacitor construction 200 includes a ruthenium-containing material as a first electrode (a bottom electrode) 220, a tantalum pentoxide dielectric material 240 which may be fanned by methods as described herein, and a second capacitor electrode (a top electrode) 250. The tantalum pentoxide dielectric material 240 may be fanned as described herein on at least a portion of the ruthenium-containing material of the first electrode 220. The second capacitor electrode 250, formed on at least a portion of the crystalline tantalum pentoxide dielectric material 240, may optionally include ruthenium metal.

FIGS. 1-3 depict example constructions and methods that can be useful for forming materials on any substrate as described herein, for example semiconductor structures, and that such applications include, but are not limited to, capacitors such as planar cells, trench cells, (e.g., double sidewall trench capacitors), stacked cells (e.g., crown, V-cell, delta cell, multi-fingered, or cylindrical container stacked capacitors), as well as field effect transistor devices.

Furthermore, a diffusion barrier material (not shown) may optionally be formed over the tantalum pentoxide dielectric material 240, and may, for example, include TiN, TaN, metal silicide, or metal silicide-nitride. While the diffusion barrier material is described as a distinct material, the barrier materials may include conductive materials and can accordingly, in such embodiments, include at least a portion of the capacitor electrodes. In certain embodiments that include a diffusion barrier material, an entirety of a capacitor electrode can include conductive barrier materials.

EXAMPLES

Example 1

A deposition chamber having a water vapor generator (water vapor generator) coupled therewith was set up with pneumatic valves under computer control to pulse valves open in sequential manner. Three reservoirs connected to the chamber contained hydrogen, oxygen, and tantalum fluoride ($TaF_5$). The substrate was silicon dioxide having a top layer of elemental ruthenium and was maintained at 400° C. for deposition of crystalline tantalum pentoxide.

The hydrogen and oxygen were fed to the water vapor generator in a hydrogen-to-oxygen atomic ratio of 6:3 (90 sccm (standard cubic centimeters per minute) of hydrogen and 45 sccm of oxygen). The tantalum fluoride and the outlet stream from the water vapor generator were then alternately pulsed into the deposition chamber to form the crystalline tantalum pentoxide. Each cycle involved a 5-second pulse of tantalum fluoride and a 5-second pulse of the water vapor generator outlet stream. The tantalum precursor and water vapor generator outlet stream were introduced with helium carrier gas, using mass flow controllers set at 100 sccm. After 100 cycles a tantalum pentoxide film 100 Å thick was obtained. A subsequent grazing incidence x-ray diffraction (GIXRD) scan of the tantalum pentoxide revealed a major peak at 2-theta equal to about 23 degrees ((003) orientation) and a minor peak at 2-theta equal to about 46 degrees ((006) orientation), thereby indicating a c-axis crystallographically textured tantalum pentoxide.

Example 2

Same as EXAMPLE 1, except the hydrogen-to-oxygen ratio was changed to 8:3. The GIXRD scan of the tantalum pentoxide revealed a major peak at 2-theta equal to about 28 degrees ((200) orientation) and minor peaks at 2-theta equal to about 50 degrees ((220) orientation) and 56 degrees ((102) orientation), thereby indicating tantalum pentoxide with a predominant a-axis orientation.

The complete disclosures of the patents, patent documents, and publications cited herein are incorporated by reference in their entirety as if each were individually incorporated. Various modifications and alterations to the embodiments described herein will become apparent to those skilled in the art without departing from the scope and spirit of the present disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows. As used herein, the term "comprising," which is synonymous with "including" or "containing," is inclusive, open-ended, and does not exclude additional unrecited elements or method steps.

What is claimed is:
1. A method of forming an oxide comprising:
contacting a ruthenium-containing material with a first vapor comprising a tantalum-containing precursor;

providing a water vapor generator comprising one or more inlet streams and an outlet stream, wherein the outlet stream comprises water; and contacting the ruthenium-containing material with the outlet stream under conditions which form crystalline tantalum pentoxide thereon.

2. The method of claim 1, wherein the crystalline tantalum pentoxide has an (003) crystallographic orientation.

3. The method of claim 1, wherein the crystalline tantalum pentoxide is as-deposited crystalline.

4. The method of claim 1, wherein the method does not include an annealing step.

5. A method of forming an oxide comprising:

contacting a ruthenium-containing material with a first vapor comprising a tantalum-containing precursor;

providing a water vapor generator comprising one or more inlet streams and an outlet stream, wherein the outlet stream comprises water and molecular hydrogen ($H_2$); and contacting the ruthenium-containing material with the outlet stream under conditions which form crystalline tantalum pentoxide thereon.

6. The method of claim 5 wherein the water in the outlet stream results from combination of $H_2O$-stoichiometric amounts of molecular oxygen ($O_2$) and molecular hydrogen ($H_2$) within the water vapor generator, and wherein the molecular hydrogen ($H_2$) in the outlet stream results from feeding an excess amount of molecular hydrogen ($H_2$) in one or more of the inlet streams above said $H_2O$-stoichiometric amounts of molecular hydrogen ($H_2$).

7. The method of claim 6, wherein the hydrogen-to-oxygen atomic ratio is at most 8:3.

8. A method of forming an oxide comprising:

contacting a ruthenium-containing material with a vapor comprising a tantalum-containing precursor;

providing a water vapor generator comprising one or more inlet streams and an outlet stream, wherein the one or more inlet streams comprise molecular hydrogen ($H_2$) and molecular oxygen ($O_2$) and wherein the hydrogen-to-oxygen ratio in the one or more inlet streams is controllable; and contacting the ruthenium-containing material with the outlet stream under conditions which form crystalline tantalum pentoxide thereon.

9. The method of claim 8, wherein the outlet stream comprises water and hydrogen.

10. The method of claim 8, wherein contacting the ruthenium-containing material with the vapor comprising a tantalum-containing precursor and contacting the ruthenium-containing material with the outlet stream are accomplished using a vapor deposition process.

11. The method of claim 10, wherein the vapor deposition process is an atomic layer deposition process comprising a plurality of deposition cycles.

12. The method of claim 11, wherein the plurality of deposition cycles comprises at least one cycle with a first hydrogen-to-oxygen ratio and at least one cycle with a second hydrogen-to-oxygen ratio, wherein the second hydrogen-to-oxygen ratio is different than the first hydrogen-to-oxygen ratio.

13. The method of claim 12, wherein the tantalum pentoxide formed using the first hydrogen-to-oxygen ratio has a crystallographic orientation different than the crystallographic orientation of the tantalum pentoxide formed using the second hydrogen-to-oxygen ratio.

14. The method of claim 8, wherein the tantalum-containing precursor is of the formula $TaX_5$, wherein each X is independently a halide.

15. The method of claim 14, wherein the tantalum-containing precursor is $TaF_5$.

16. The method of claim 8, wherein the conditions comprise a temperature for a surface of the ruthenium-containing material of 400° C. to 500° C.

17. The method of claim 8, wherein the crystalline tantalum pentoxide has a thickness of at least 50 angstroms.

18. The method of claim 8, wherein the hydrogen-to-oxygen atomic ratio is at least 6:3.

19. The method of claim 8, wherein the hydrogen-to-oxygen atomic ratio is at most 8:3.

20. A method of forming an oxide comprising:

contacting a ruthenium-containing material with a first vapor comprising a tantalum-containing precursor; and contacting the ruthenium-containing material with a second vapor comprising molecular hydrogen ($H_2$) and water under conditions which form crystalline tantalum pentoxide thereon.

* * * * *

UNITED STATES PATENT AND TRADEMARK OFFICE
CERTIFICATE OF CORRECTION

PATENT NO. : 8,208,241 B2
APPLICATION NO. : 12/132758
DATED : June 26, 2012
INVENTOR(S) : Vishwanath Bhat et al.

Page 1 of 1

It is certified that error appears in the above-identified patent and that said Letters Patent is hereby corrected as shown below:

On the face page, in field (54), and in column 1, line 1, in "Title" delete "ORIENTATED" and insert -- ORIENTED --, therefor.

Signed and Sealed this
Sixth Day of November, 2012

David J. Kappos
*Director of the United States Patent and Trademark Office*